United States Patent
Wynne et al.

(10) Patent No.: US 10,224,325 B2
(45) Date of Patent: Mar. 5, 2019

(54) APPARATUS AND ASSOCIATED METHOD

(71) Applicant: Nexperia B.V., Nijmegen (NL)

(72) Inventors: Barry Wynne, Glossop (GB); Mark Andrzej Gajda, Hazel Grove (GB)

(73) Assignee: Nexperia B.V., Nijmegen (NL)

( * ) Notice: Subject to any disclaimer, the term of this patent is extended or adjusted under 35 U.S.C. 154(b) by 0 days.

(21) Appl. No.: 15/377,816

(22) Filed: Dec. 13, 2016

(65) Prior Publication Data

US 2017/0207215 A1   Jul. 20, 2017

(30) Foreign Application Priority Data

Jan. 18, 2016 (EP) ..................... 16151746

(51) Int. Cl.
*H01L 29/16* (2006.01)
*H01L 29/20* (2006.01)
(Continued)

(52) U.S. Cl.
CPC .......... *H01L 27/0883* (2013.01); *H01L 24/48* (2013.01); *H01L 28/20* (2013.01);
(Continued)

(58) Field of Classification Search
CPC ..... H01L 17/08; H01L 17/085; H01L 17/088; H01L 17/0883; H01L 29/16; H01L 29/1608; H01L 29/161; H01L 29/20; H01L 29/2003; H01L 29/24; H01L 29/76; H01L 29/772; H01L 29/778; H01L 29/7786; H01L 29/78; H01L 2224/48135; H01L 2224/48137; H01L 2924/0001;
(Continued)

(56) References Cited

U.S. PATENT DOCUMENTS

2014/0346570 A1   11/2014   Katsunori
2015/0084685 A1   3/2015   Tatsuya et al.

FOREIGN PATENT DOCUMENTS

CN   104049666 A   9/2014
EP   2736171 A1   5/2014

OTHER PUBLICATIONS

Extended European Search Report for Patent Appln. No. 16151746.1 (dated Jul. 5, 2016).

*Primary Examiner* — Lincoln D Donovan
*Assistant Examiner* — Diana J. Cheng
(74) *Attorney, Agent, or Firm* — Ohlandt, Greeley, Ruggiero & Perle, L.L.P.

(57) ABSTRACT

A semiconductor arrangement comprising; a normally-on transistor having first and second main terminals and a control terminal, a normally-off transistor having first and second main terminals and a control terminal, the transistors connected in a cascode arrangement by a connection between one of the main terminals of the normally-on transistor and one of the main terminals of the normally-off transistor, a current-source arrangement connected to a node on the connection and configured to provide for control of the voltage at said node between the normally-on and normally-off transistors by providing for a predetermined current flow, wherein the semiconductor arrangement comprises a first semiconductor die of III-V semiconductor type having the normally-on transistor formed therein and a second semiconductor die having the normally-off transistor formed therein, the current-source arrangement formed in the first and/or second semiconductor dies.

14 Claims, 2 Drawing Sheets

(51) Int. Cl.
*H01L 29/24* (2006.01)
*H01L 29/78* (2006.01)
*H01L 27/088* (2006.01)
*H01L 23/00* (2006.01)
*H01L 49/02* (2006.01)
*H01L 29/161* (2006.01)
*H01L 29/778* (2006.01)
*H03K 17/0814* (2006.01)
*H03K 17/10* (2006.01)

(52) U.S. Cl.
CPC ............ *H01L 29/16* (2013.01); *H01L 29/161* (2013.01); *H01L 29/1608* (2013.01); *H01L 29/20* (2013.01); *H01L 29/2003* (2013.01); *H01L 29/24* (2013.01); *H01L 29/7786* (2013.01); *H01L 29/78* (2013.01); *H03K 17/0814* (2013.01); *H03K 17/102* (2013.01); *H03K 17/107* (2013.01); *H01L 2224/48137* (2013.01); *H01L 2924/00014* (2013.01)

(58) Field of Classification Search
CPC .......... H01L 2924/00014; H03K 17/08; H03K 17/081; H03K 17/0814; H03K 17/08142; H03K 17/08148; H03K 17/10; H03K 17/102; H03K 17/107
USPC .................. 327/108–112, 427, 429–431, 434
See application file for complete search history.

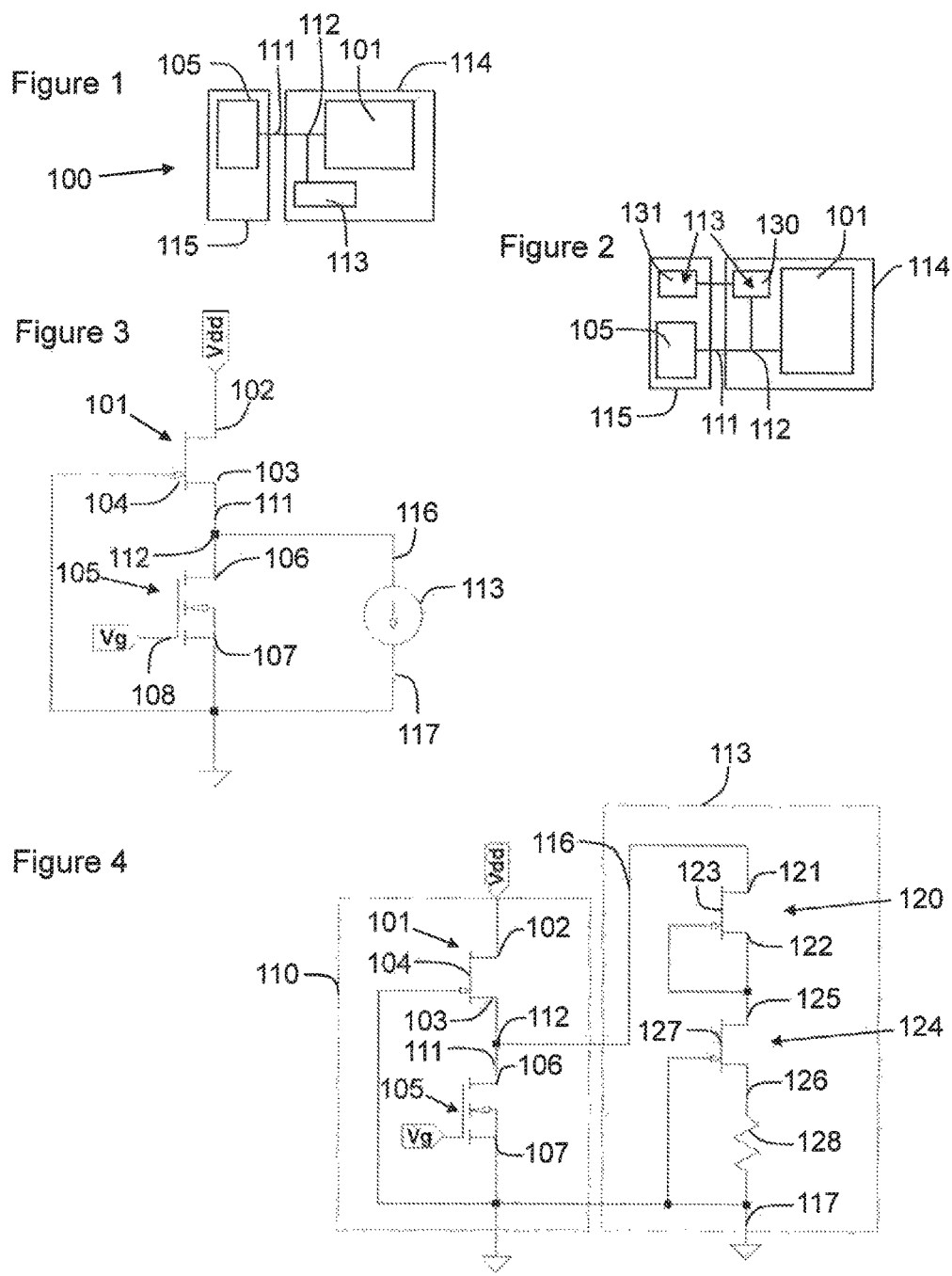

APPARATUS AND ASSOCIATED METHOD

CROSS-REFERENCE TO RELATED APPLICATIONS

This application claims the priority under 35 U.S.C. § 119 of European Patent application no. 16151746.1, filed on Jan. 18, 2016, the contents of which are incorporated by reference herein.

The present disclosure relates to the field of semiconductor arrangements. In particular, it relates to a cascode arrangement of a normally-on transistor and a normally-off transistor.

According to a first aspect of the present disclosure there is provided a semiconductor arrangement comprising;
- a normally-on transistor having first and second main terminals and a control terminal,
- a normally-off transistor having first and second main terminals and a control terminal,
- the normally-on transistor and the normally-off transistor connected in a cascode arrangement by a connection between one of the first and second main terminals of the normally-on transistor and one of the first and second main terminals of the normally-off transistor,
- a current-source arrangement connected to a node on the connection and configured to provide for control of the voltage at said node between the normally-on and normally-off transistors by providing for a predetermined current flow,
- wherein the semiconductor arrangement comprises a first semiconductor die of III-V semiconductor type having the normally-on transistor formed therein and a second semiconductor die having the normally-off transistor formed therein, the current-source arrangement formed in the first and/or second semiconductor dies.

This is advantageous as the current-source arrangement has been found to be advantageous for controlling a floating-node voltage in a cascade arrangement. Further, the current-source arrangement can be implemented effectively and efficiently in a cascade arrangement that includes components in a III-V semiconductor die.

In one or more embodiments, the current-source arrangement comprises;
- a transistor having a drain, a source and a gate;
- the source of the transistor connected to the gate of the transistor through a resistor element; and
- wherein the node is connected to the drain of the transistor.

In one or more embodiments, the source of the transistor is configured to be connected to a nominal voltage, such as ground, or any other circuit voltage depending on the implementation of the arrangement. In one or more embodiments, the transistor is formed in the first semiconductor die. In one or more embodiments, the resistor element is formed in first semiconductor die.

In one or more embodiments, the current-source arrangement comprises;
- a first transistor having a drain, a source and a gate and a second transistor having a drain, a source and a gate;
- the source of the first transistor connected to the drain of the second transistor;
- the source of the first transistor connected to gate of the first transistor;
- the source of the second transistor connected to the gate of the second transistor through a resistor element;
- wherein the node is connected to the drain of the first transistor.

In one or more embodiments, the source of the second transistor is configured to be connected to a nominal voltage, such as ground, or any other circuit voltage depending on the implementation of the arrangement.

In one or more embodiments, the first transistor and the second transistor are formed in the first semiconductor die.

In one or more embodiments, the resistor element is formed in first semiconductor die. In one or more embodiments, the resistor element comprises, at least in part, a track formed in a two dimensional electron gas region of the first semiconductor die. This is advantageous as the resistance of the semiconductor die may be conveniently used to form the resistor element by isolating a track in the die.

In one or more embodiments, the resistor element is formed in the second semiconductor die. In one or more embodiments, the resistor element is a discrete component.

In one or more embodiments, the first and/or second transistors are HEMTs. In one or more embodiments the HEMTS are of Schottky-gate or insulated-gate type. In one or more embodiments, the first and/or second transistors are selected from MOS transistors, HEMTs, MISHEMTs, SiC transistors and BJTs.

In one or more embodiments, the normally-on transistor is selected from a high-electron-mobility transistor (HEMT or MISHEMT) and a power transistor.

In one or more embodiments, the normally-off transistor is selected from a MOS transistor and a LVMOS transistor.

In one or more embodiments, the first semiconductor die is of Gallium Nitride or Gallium Arsenide, Indium Phosphide, Aluminium Nitride, Indium Gallium Nitride, Gallium Oxide ($Ga_2O_3$) or any other III-V semiconductor material suitable for power switching applications. In one or more embodiments, the first semiconductor die is of a material for forming normally-on devices.

In one or more embodiments, the second semiconductor die is of silicon, Silicon Germanium (SiGe), Silicon Carbide (SiC) or any other semiconducting material suitable for power applications.

In one or more embodiments, the current-source is configured to provide a current flow of between 0.1 and 10 µA and the normally-off transistor has a breakdown voltage of less than 40 V. In one or more embodiments, the current-source is configured to provide a current flow of substantially 5 µA and the normally-off transistor has a breakdown voltage of substantially 40 V.

In one or more embodiments, the first semiconductor die and the second semiconductor die comprise the only dies in the semiconductor package incorporating the cascode arrangement and the current-source arrangement.

According to a second aspect of the present disclosure there is provided a semiconductor package including the semiconductor arrangement of the first aspect.

In one or more examples, the first semiconductor die and the second semiconductor die comprise the only dies in the semiconductor package implementing the cascode arrangement and the current-source arrangement. This is advantageous as the semiconductor arrangement and the semiconductor package provide a two-die implementation of a cascode arrangement in III-V and IV semiconductor material with floating-node voltage control. Control over the floating-node voltage ensures that the floating-node voltage is correctly set, which in turn ensures that during switching from on-state to off-state the normally-on device is maintained correctly in its off-state and the normally-on device does not suffer from excursions into its avalanche breakdown mode of operation.

According to a third aspect of the present disclosure there is provided an electronic device including the semiconductor arrangement of the first aspect or the semiconductor package of the second aspect. The electronic device may comprise an amplifier, a cell tower for a mobile phone network, a power supply in a variety of applications, an inverter, a power factor correction (PFC) circuit, half- or full-bridge as well as other power circuit topologies.

According to a fourth aspect of the present disclosure there is provided a method comprising;
  driving a normally-on transistor with a normally-off transistor, the normally-on transistor and the normally-off transistor connected in a cascode arrangement by a connection between one of first and second main terminals of the normally-on transistor and one of first and second main terminals of the normally-off transistor,
  providing for a predetermined, fixed, current flow from a node on the connection by way of a current-source arrangement connected to the node and configured to provide for control of the voltage at said node when in the off-state,
  wherein the normally-on transistor is formed in a first semiconductor die of III-V semiconductor type and the normally-off transistor is formed in a second, different, semiconductor die, the current-source arrangement formed in the first and/or second semiconductor dies.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The Figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which:

FIG. 1 shows a schematic view of a first example semiconductor arrangement;

FIG. 2 shows a schematic view of a second example semiconductor arrangement;

FIG. 3 shows a semiconductor component layout diagram which may be arranged according to the first and second example semiconductor arrangements; and FIG. 4 shows the semiconductor component layout diagram of FIG. 3 with an example current-source semiconductor component layout;

Figure 5:
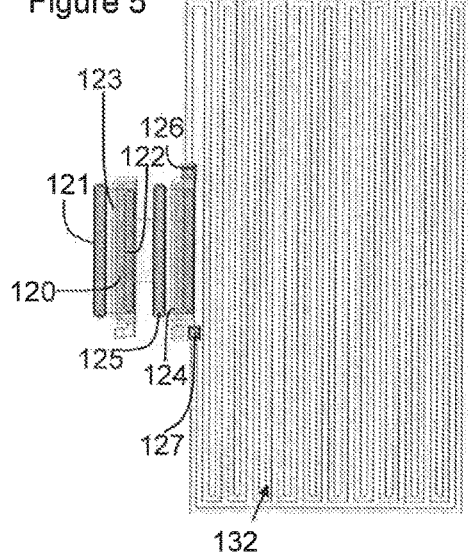
FIG. 5 shows an example schematic layout of the current-source semiconductor component layout.

In cascode arrangements that utilise a III-V based normally-on transistor, a normally-off transistor is used to realise a normally-off switch. Such a cascode arrangement includes a floating-node between the normally-on transistor and the normally-off transistor. The voltage at the floating-node may, in some situations, be sufficient to cause avalanche breakdown of the normally-off transistor. It therefore may be advantageous to control the voltage at the floating-node.

With reference to FIGS. 1 to 4, an example semiconductor arrangement 100 is shown comprising a normally-on transistor 101 having first and second main terminals 102, 103 and a control terminal 104. The arrangement 100 further comprises a normally-off transistor 105 having first and second main terminals 106, 107 and a control terminal 108. The normally-on transistor 101 and the normally-off transistor 105 connected in a cascode arrangement 110 by a connection 111 between one of the first and second main terminals 102, 103 of the normally-on transistor 101 and one of the first and second main terminals 106, 107 of the normally-off transistor 105. It will be appreciated that for a transistor the main terminals are those that connect to the main current path through the transistor (typically termed source and drain), while the control terminal is configured to receive a signal to control the conductance of the main current path (typically termed gate).

When the cascode arrangement in FIG. 3 switches from on-state to off-state, the voltage at the floating-node 112 on the connection 111 is controlled, in this example, by a current-source arrangement 113 connected to the node 112 and configured to provide for control of the voltage between the normally-on and normally-off transistors by providing for a predetermined current flow. After a switching event, the voltage at which the floating-node settles plays an important role in ensuring that transistor 101 remains turned off and that transistor 105 transistor does not experience avalanche. Thus, by virtue of the nature of a current-source arrangement, a predetermined and dominant (with respect to other available leakage paths) current flow can be set between node 112 and ground, which has been found to effectively control the voltage that may be reached at the node 112. The current flow comprises a leakage current. The leakage current is established and controlled by the combined resistance of 128 and 124 within the current-source. When correctly chosen, this leakage current may perform the dual role of maintaining the normally-on transistor 101 in its off-state and preventing the normally-off transistor 105 from reaching its avalanche breakdown voltage.

The semiconductor arrangement 100 comprises a first semiconductor die 114 of III-V semiconductor type having the normally-on transistor 101 formed therein and a second semiconductor die 115 having the normally-off transistor 105 formed therein. The current-source arrangement 113 may be formed substantially wholly within the first semiconductor die 114, substantially wholly within the second semiconductor die 115 or may be distributed over the first and second semiconductor dies 114, 115.

The first semiconductor die 114, in this example, is of Gallium Nitride (GaN). In other examples, it may be of Gallium Arsenide (GaAs), Indium Phosphide, Aluminium Nitride, Indium Gallium Nitride, Gallium Oxide ($Ga_2O_3$) or other III-V semiconductors. The second semiconductor die 115 is of silicon but equally it could be made of other semiconducting materials such as SiGe or SiC.

In this example, the normally-on transistor 101, which is a III-V transistor, is a high-electron-mobility transistor with an insulated gate (MISHEMT). However, it will be appreciated that the normally-on transistor may be another type of a power transistor configured to operate in depletion mode, such as a JFET. In this example, the normally-off transistor 105 is a MOS transistor and, in particular, an LVMOS (low voltage MOS transistor). It will be appreciated that in other examples, the normally-off transistor may comprise a different type of power transistor such as a trench MOS transistor, DMOS, smart-power, SiC, BJT and other enhancement-mode device for power applications.

The first and second main terminals 102, 103 of the HEMT 101 comprise drain and source respectively. The control terminal 104 of the HEMT 101 comprises a gate. The drain 102 is configured to be connected to a supply voltage, Vdd. The first and second main terminals 106, 107 of the MOS transistor 105 comprise drain and source respectively. The control terminal 108 of the MOS transistor comprises a gate. The connection 111 is formed between the source 103 of the HEMT 101 and the drain 106 of the MOS transistor 105. Accordingly, the node 111 may be considered to be at the source 103 of the HEMT or the drain 106 of the MOS transistor. The connection 111 may be implemented as a bond wire extending between a respective source bond pad and drain bond pad of the HEMT 101 and the MOS transistor 105, between the semiconductor dies.

With reference to the cascade arrangement 110, the source of the MOS transistor 105 is configured to be connected to a nominal voltage, such as ground. Further, in this example, the source 107 of the MOS transistor 105 (normally-off transistor) is connected to the gate of the HEMT 104 (normally-on transistor). A control voltage Vg is provided at the gate 108 of the MOS transistor for control of the cascade arrangement 110.

In this example, the current-source arrangement 113 has two terminals comprising a first terminal 116 and a second terminal 117. The first terminal 116 is connected to the node 112. The second terminal 117 is configured to be connected to a nominal voltage, such as ground.

The current-source arrangement 113 may comprise a diode and a transistor in series, the transistor configured to be connected to a nominal voltage, such as ground, via a resistor element. The first terminal 116 may be provided by a first terminal of the diode, wherein a second terminal of the diode is connected to the transistor. The gate of the transistor may be configured to be connected to the nominal voltage such as ground. The diode arrangement may comprise a transistor where its source is connected to its gate and its drain comprises the first terminal 116 of the current-source arrangement 113.

In this example, the current-source arrangement 113, with reference to FIG. 4, comprises a first transistor 120 having a drain 121, a source 122 and a gate 123 (such as a Schottky gate) and a second transistor 124 having a drain 125, a source 126 and a gate 127. The first and second transistors are arranged in series. The source 122 of the first transistor 120 is connected to the drain 125 of the second transistor 124. The source 122 of the first transistor 120 is connected to gate 123 of the first transistor 120, which effectively forms a diode arrangement. The source 126 of the second transistor 124 is connected to the gate 127 of the second transistor 124 through a resistor element 128. Further, the source 126 of the second transistor 124 is configured to be connected to a nominal voltage, such as ground, through the resistor element 128. The first terminal 116 of the current-source arrangement thus comprises the drain 121 of the first transistor 120, which is connected to the floating-node 112.

In another example, the current-source arrangement 113 does not include the transistor 120 and the drain 125 of the second transistor 124 comprises the first terminal 116 of the current-source arrangement. Accordingly, the drain 125 of the second transistor 120 is connected to the floating-node 112. It will be appreciated that in this example, the "second" transistor may be renamed as the transistor of the current source.

In the arrangements of FIGS. 1 and 2, the first transistor 120 and the second transistor 124 of the current-source arrangement 113 are formed in the first semiconductor die 114. However, it will be appreciated that they may be formed in the second semiconductor die in other examples or be implemented in a separate third die. In this example, the first transistor 120 and the second transistor 124 of the current-source arrangement 113 comprise HEMTs. The HEMTs 120, 124 of the current-source arrangement may be of substantially equal size, such as around 200 μm in gate width. The HEMTs 120, 124 of the current-source arrangement may be smaller (much smaller) than the HEMT 101 of the cascode arrangement 110. While the transistors 120, 124 of the current-source arrangement 113 comprise HEMTs in this example, they may be a different type of transistor, such as MISHEMTs implemented in GaN or silicon transistors comprising a current-source implemented on a separate die and connected to the floating-node 112 via bond wires.

In this example, the resistor element is between 100 kΩ and 10 MΩ or 500 kΩ and 1.5 MΩ, or substantially 1 MΩ. In particular, the resistor element may be sized to achieve a current flow through the current-source arrangement 113 of between 1 and 10 μA, such as substantially 5 μA. Such a current flow has been found to provide for effective control of the voltage at the floating-node 112.

The current through the current-source 113 is chosen so that it dominates the leakage in the cascode circuit once transistor 101 reaches its off-state condition. This ensures that the floating-node 112 settles at a predictable voltage that is substantially entirely controlled by the current-source 113.

The off-state condition of transistor 101 is met when the floating-node voltage rises above the threshold voltage ($V_T$) of transistor 101. The $V_T$ of transistor 101 is typically −10V to −20V, which means that the floating-node voltage will settle a little above this value.

A safe and dominant leakage current flowing through the current source 113 may be at least 50× or 100× greater than a leakage current of transistor 101 and/or 105, which will typically leak 10 s of nA each. Hence, the current flow provided by the current source may be several μA.

For the purpose of illustration, let us assume that the threshold voltage $V_T$ of the transistor 101 is −20V and that the leakage of the transistor 101 and/or transistor 105 is 20 nA, which means that the leakage through the current-source 113 may be set to 100×20 nA=2 μA (100× leakage current).

Knowing the required current-source leakage of 2 μA, one can use Ohm's law to work out the required total resistance of the current source arrangement 113:

$$R_{113} = \frac{V_{T101}}{I_{113}} = \frac{20 \text{ V}}{2 \text{ μA}} = 10 \text{ MOhm}$$

Where $R_{113}$ is the resistance of the current source arrangement 113, $V_{T101}$ is the threshold voltage of the transistor 101 and $I_{112}$, is the desired current through the current-source arrangement.

Accordingly, the current source arrangement may be configured such that the 10 MOhms in this example is made up of resistor 128 and the resistance of transistor 124, determined by its sub-threshold operation transconductance. The transconductance of any transistor is set by its manufacturing technology and will vary from product to product.

Therefore, it is necessary to select the value of resistor 128 until the combined resistance of 128 and 124 is approximately 10 MOhms. It will be appreciated that transistors with a wide range of resistances may be used for transistor 124 and accordingly the value of the resistor 128 may be between 100 kOhm and 5 MOhm.

By way of further explanation the reasons for making the leakage in the current-source 113 substantially dominant are explained below.

Figure 8:
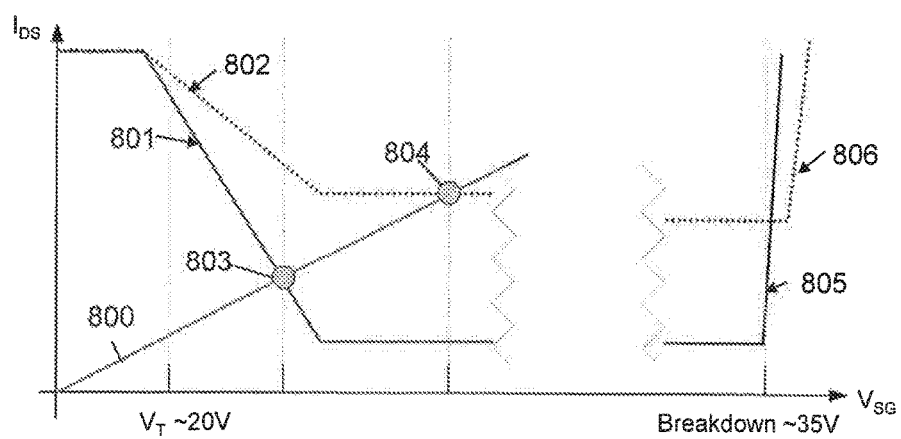
FIG. 8 shows a graph illustrating a current leakage curve of the transistors at different temperatures and a load line of the current source.

During transient events the floating-node voltage is set by the ratio of a $C_{OSS}$ capacitance in transistor 101 and 105, while in steady-state operation (away from transients) the floating-node voltage may settle at an intersection 803, 804 of the current-source 113 loadline 800 and a leakage curve 801, 802 (curve 801 represents a typical leakage curve at 25° C. and curve 802 represents a typical leakage curve at 100° C.) of the transistor 101 or 105, as illustrated schematically in FIG. 8. FIG. 8 shows the drain-source current of the transistor 101 versus the source-gate current of the transistor 101. In the left part of FIG. 8 there is shown the drain-source current of the transistor 101 versus the source-gate current of the transistor 101, while in the right part of FIG. 8 there is shown schematically the leakage and breakdown voltage curve (805 and 806) of the transistor 105 versus the source-gate current of the transistor 101.

When the transistor 101 enters its off-state, there will be competition between a gate leakage $I_{DG}$ of the transistor 101 and a drain leakage $I_{DS}$ of transistor 105. As a result, the floating-node voltage may be poorly defined and inconsistent from device to device.

To counteract this competition and to set the floating-node voltage accurately, the current source arrangement 113 provides a parallel leakage path, which may be higher than the floating-node to ground leakage path. This way control over the floating-node voltage is established and substantially determined by the current-source arrangement 113.

It may be desirable, for reliable operation, for the floating-node voltage to settle above the $V_T$ of transistor 101 and below breakdown voltage $BV_{OSS}$ of transistor 105, such as half-way between these two voltages. This is indicated schematically in FIG. 8 as loadline intersections 803, 804.

The intersection point 803 and thus the current provided by the current source arrangement may be chosen in accordance with one or more of the following conditions (with reference to FIG. 8):

the current is such that the voltage at the node 112 may be greater than $V_T$ of transistor 101, such as by 1-5 volts;
the current is such that the voltage at the node 112 may be such that the current-source 113 loadline intersects the transistor 101 and/or 105's leakage curve at point 803, which represents a current much greater than the background leakage of transistor 101 and/or 105. In this example, the intersection point is at 2 µA vs a leakage of 20 nA, that is, a factor of 100× greater;
the current is such that the voltage at the node 112 voltage may be below the breakdown voltage of transistor 105 transistor by substantially 3-5 volts.

In another example, not shown, the transistors 120, 124 of the current-source arrangement 113 are provided in the second semiconductor die 115 with the MOS transistor 105. In another example, not shown, one of the transistors 120, 124 of the current-source arrangement 113 is provided in the first semiconductor die 114 and the other is provided in the second semiconductor die 115.

In FIG. 1, the resistor element 128 is formed in the first, GaN, semiconductor die 114. Thus, the current-source arrangement is formed substantially exclusively in the first semiconductor die 114. In FIG. 2, an alternative layout is provided in which the current-source arrangement 113 is split over the two semiconductor dies 114, 115. The transistors 120, 124 of the current-source arrangement 113 are, in this example, located in the first semiconductor die 114 represented by box 130 and the resistor element 128 is located in the second semiconductor die 115 represented by box 131. The resistor element 128 may comprise a discrete component or comprise a thin film resistor. In a further example, the resistor element 128 is provided over both the first and second semiconductor dies 114, 115.

It will be appreciated that however the resistor element is formed it essentially comprises a path of resistive material, which can include connections between parts of the dies. Thus, while the majority of the resistance provided by the resistor element 128 may be located on one of the dies 114, 115 it will be appreciated that connections between the dies may contribute to its desired total resistance.

Considering first the layout of FIG. 1, the resistor element 128 is formed within the III-V semiconductor material. Thus, a track formed by component isolation techniques is arranged in the first, III-V, semiconductor die 114 having the desired resistance. For a semiconductor die of GaN, the conductive two dimensional electron gas region (2DEG) has a sheet resistance of approximately 650 Ω/sq. Thus, for a track width of approximately 5 µm and a track length of 7.7 mm a resistor element of resistance IMO may be achieved.

FIG. 5 shows an example layout in the second semiconductor die 114 of the current-source arrangement 113. FIG. 5 shows the first transistor 120 connected to the second transistor 124 and a resistive track 132 providing the resistor element 128 connected between the source 126 and the gate 127 of the second transistor 124.

Figure 6:
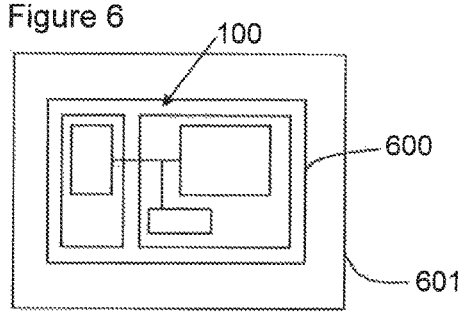
FIG. 6 shows an example electronic device and a package.

FIG. 6 shows a package 600 including the semiconductor arrangement 100 described above. The package 600 may include only two semiconductor dies comprising the first, III-V, semiconductor die 114 and the second semiconductor die 115. The package 600 typically includes leads for connection to other components (not shown). The package is shown as part of an electronic device 601. The electronic device 601 may comprise an amplifier, a mobile cell tower, a communication device, a power supply with half-bride or full bridge circuit topology, a PFC control circuit or an inverter in solar panels.

Figure 7:
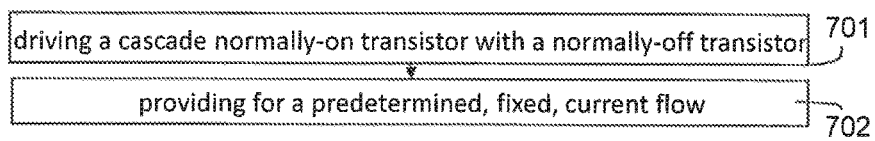
FIG. 7 shows a flowchart illustrating a method.

FIG. 7 shows a method of operating a cascode arrangement of a normally-on transistor driven by a normally-off transistor. The method comprises driving 701 a normally-on transistor 101 with a normally-off transistor 105, the normally-on transistor 101 and the normally-off transistor 105 connected in a cascode arrangement 110 by a connection 111 between one of first and second main terminals 103 of the normally-on transistor and one of first and second main terminals 106 of the normally-off transistor. The method comprises providing 702 for a predetermined, fixed, current flow from a node 112 on the connection by way of a current-source arrangement 113 connected to the node and configured to provide for control of the voltage at said node, wherein, the normally-on transistor is formed in a first semiconductor die 114 of III-V semiconductor type and the normally-off transistor is formed in a second, different, semiconductor die 115, the current-source arrangement formed in the first and/or second semiconductor dies 114, 115.

The instructions and/or flowchart steps in the above Figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Various terminals are described above as connected to a supply voltage, Vdd, or a nominal voltage. It will be appreciated that the arrangement disclosed herein may be connected to other circuitry in a variety of ways and therefore the nominal voltage may be a different supply voltage to the supply voltage Vdd, or may be ground.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A semiconductor arrangement comprising;
a normally-on transistor having a first main terminal, a second main terminal, and a control terminal,
a normally-off transistor having a first main terminal, a second main terminal, and a control terminal,
the normally-on transistor and the normally-off transistor connected in a cascode arrangement by a connection between one of the first main terminal and the second main terminal of the normally-on transistor and one of the first main terminal and the second main terminal of the normally-off transistor,
a current-source arrangement connected to a node on the connection and configured to provide for control of the voltage at the node between the normally-on and normally-off transistors by providing for a predetermined current flow, wherein the current-source arrangement comprises:
a first transistor having a drain, a source and a gate;
a second transistor having a drain, a source and a gate;
the source of the first transistor connected to the drain of the second transistor;
the source of the first transistor connected to gate of the first transistor; and
the source of the second transistor connected to the gate of the second transistor through a resistor element, wherein the node is connected to the drain of the first transistor, and
wherein the semiconductor arrangement comprises a first semiconductor die of III-V semiconductor type having the normally-on transistor formed therein and a second semiconductor die having the normally-off transistor formed therein, the current-source arrangement formed in the one or both of the first semiconductor die and the second semiconductor die.

2. The semiconductor arrangement of claim 1, wherein the first transistor and the second transistor are formed in the first semiconductor die.

3. The semiconductor arrangement of claim 1 or claim 2, wherein the resistor element is formed in first semiconductor die.

4. The semiconductor arrangement of claim 3, wherein the resistor element comprises a track formed in a two dimensional electron gas region of the first semiconductor die.

5. The semiconductor arrangement of claim 2, wherein the resistor element is formed in the second semiconductor die.

6. The semiconductor arrangement of claim 2, wherein the one or both of the first transistor and the second transistor are HEMTs.

7. The semiconductor arrangement of claim 1, wherein the normally-on transistor is selected from a high-electron-mobility transistor (HEMT) and a power transistor.

8. The semiconductor arrangement of 1, wherein the normally-off transistor is selected from a MOS transistor and a LVMOS transistor.

9. The semiconductor arrangement of claim 1, wherein the first semiconductor die is selected from the group of: Gallium Nitride, Gallium Arsenide, Indium Phosphide, Aluminum Nitride, Indium Gallium Nitride, and Gallium Oxide ($Ga_2O_3$).

10. The semiconductor arrangement of claim 1, wherein the second semiconductor die is selected from the group of: Silicon, Silicon Germanium (SiGe), and Silicon Carbide (SiC).

11. The semiconductor arrangement of claim 10, wherein the current-source is configured to provide a current flow of between 0.1 and 10 µA and the normally-off transistor has a breakdown voltage of less than 40 V.

12. A semiconductor package including the semiconductor arrangement of claim 1.

13. An electronic device including the semiconductor arrangement of claim 1.

14. A method comprising;
driving a normally-on transistor with a normally-off transistor, the normally-on transistor and the normally-off transistor connected in a cascode arrangement by a connection between one of a first main terminal and a second main terminal of the normally-on transistor and one of first main terminal and the second main terminal of the normally-off transistor, providing for a predetermined, fixed, current flow from a node on the connection by a current-source arrangement connected to the node and configured to provide for control of the voltage at the node, wherein the current-source arrangement comprises:
a first transistor having a drain, a source and a gate;
a second transistor having a drain, a source and a gate;
the source of the first transistor connected to the drain of the second transistor;
the source of the first transistor connected to gate of the first transistor; and
the source of the second transistor connected to the gate of the second transistor through a resistor element, wherein the node is connected to the drain of the first transistor, and wherein the normally-on transistor is formed in a first semiconductor die of III-V semiconductor type and the normally-off transistor is formed in a second, different, semiconductor die, the current-source arrangement formed in one or both of the first semiconductor die and the second semiconductor die.

* * * * *